(12) United States Patent
Yu et al.

(10) Patent No.: US 12,508,683 B2
(45) Date of Patent: Dec. 30, 2025

(54) IN-LINE MANUFACTURING APPARATUS

(71) Applicant: Samsung Display Co., LTD., Yongin-si (KR)

(72) Inventors: Doo Seon Yu, Cheonan-si (KR); Gyung Min Baek, Yongin-si (KR); Hyun Eok Shin, Gwacheon-si (KR); You Jong Lee, Seoul (KR); Myung Soo Huh, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 559 days.

(21) Appl. No.: 17/680,633

(22) Filed: Feb. 25, 2022

(65) Prior Publication Data

US 2022/0371138 A1 Nov. 24, 2022

(30) Foreign Application Priority Data

May 21, 2021 (KR) ........................ 10-2021-0065373

(51) Int. Cl.
*B23Q 7/14* (2006.01)
*B23Q 11/10* (2006.01)

(52) U.S. Cl.
CPC ................ *B23Q 7/14* (2013.01); *B23Q 11/10* (2013.01)

(58) Field of Classification Search
None
See application file for complete search history.

(56) References Cited

U.S. PATENT DOCUMENTS

| 4,851,095 | A |   | 7/1989 | Scobey et al. |
| 5,124,013 | A |   | 6/1992 | Seddon et al. |
| 5,203,399 | A | * | 4/1993 | Koizumi ............... F25B 23/006 |
|           |   |   |        | 361/699 |
| 5,225,057 | A |   | 7/1993 | LeFebvre et al. |
| 5,340,401 | A | * | 8/1994 | Cann ...................... C30B 29/04 |
|           |   |   |        | 118/724 |
| 5,618,388 | A |   | 4/1997 | Seeser et al. |
| 5,798,027 | A |   | 8/1998 | Lefebvre et al. |
| 5,879,519 | A |   | 3/1999 | Seeser et al. |
| 6,228,171 | B1 | * | 5/2001 | Shirakawa ........ H01L 21/67103 |
|           |   |   |        | 118/724 |
| 6,841,031 | B2 | * | 1/2005 | Iwata .................. C03C 23/0085 |
|           |   |   |        | 156/345.22 |
| 8,257,498 | B2 | * | 9/2012 | Yamawaku ....... H01L 21/67781 |
|           |   |   |        | 414/217 |

(Continued)

FOREIGN PATENT DOCUMENTS

| KR | 1992-0004846 | 6/1992 |
| KR | 2003-0068291 | 8/2003 |

(Continued)

OTHER PUBLICATIONS

Machine Generated English Translation of KR1020060133327A published Dec. 26, 2006. Held to Kim Jong Won (Year: 2006).*

*Primary Examiner* — Sylvia Macarthur
(74) *Attorney, Agent, or Firm* — CANTOR COLBURN LLP

(57) ABSTRACT

An in-line manufacturing apparatus includes a carrier that transports a substrate, a plurality of process chambers subjected to a manufacturing process on the substrate transported through the carrier, and a cooling part disposed adjacent to the carrier and movable with the carrier.

16 Claims, 11 Drawing Sheets

(56) References Cited

U.S. PATENT DOCUMENTS

| | | | |
|---|---|---|---|
| 8,900,366 B2* | 12/2014 | Rosenblum | H10K 50/84 |
| | | | 118/724 |
| 2007/0048979 A1* | 3/2007 | Fukuoka | H01L 21/67098 |
| | | | 438/490 |
| 2010/0188818 A1* | 7/2010 | Li | F28D 15/046 |
| | | | 29/890.032 |
| 2011/0183461 A1* | 7/2011 | Probst | H01L 21/67098 |
| | | | 118/724 |
| 2015/0188399 A1* | 7/2015 | Fukasawa | H02K 41/031 |
| | | | 310/12.11 |
| 2016/0196997 A1 | 7/2016 | White et al. | |
| 2018/0308723 A1* | 10/2018 | Otani | H01L 21/6719 |
| 2021/0180869 A1* | 6/2021 | Sun | F28D 15/0275 |
| 2022/0371138 A1* | 11/2022 | Yu | B23Q 7/14 |

FOREIGN PATENT DOCUMENTS

| | | |
|---|---|---|
| KR | 10-2006-0133327 | 12/2006 |
| KR | 10-1423661 | 7/2014 |
| KR | 10-1431606 | 8/2014 |
| KR | 1020160062065 A | 6/2016 |
| KR | 1020190091763 A | 8/2019 |

* cited by examiner

IN-LINE MANUFACTURING APPARATUS

CROSS-REFERENCE TO RELATED APPLICATION(S)

This application claims priority to and the benefit of Korean Patent Application No. 10-2021-0065373 under 35 U.S.C. § 119, filed in the Korean Intellectual Property Office (KIPO) on May 21, 2021, the entire contents of which are incorporated herein by reference.

BACKGROUND

1. Technical Field

The disclosure relates to an in-line manufacturing apparatus.

2. Description of the Related Art

When manufacturing a display device or the like using an in-line manufacturing apparatus, thin films may be deposited on a substrate while the substrate to be processed passes through chambers used in the process.

The temperature of the substrate may be increased as each process of the substrate to be processed is sequentially performed in chambers.

As the temperature of the substrate increases, the substrate may be deformed by heat, which prevents the surface of the substrate from being flat. If the surface of the substrate is not kept flat, the accuracy of the process may decrease.

On the other hand, if the inside of the chamber for performing the process on the substrate becomes complicated, the performance of the chamber may be deteriorated and maintenance may become difficult.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a line manufacturing apparatus that can prevent a temperature rise of the substrate within a plurality of chambers of the in-line manufacturing apparatus, and the process chamber has a structure that prevents performance deterioration and maintenance difficulties of the manufacturing apparatus.

However, the problems to be solved by the embodiments are not limited to the above-described problems, and may be variously expanded in the range of the technical ideas included in the embodiments.

An in-line manufacturing apparatus according to an embodiment may include a carrier that transports a substrate, a plurality of process chambers subjected to a manufacturing process on the substrate transported through the carrier, and a cooling part disposed adjacent to the carrier and movable with the carrier.

The in-line manufacturing apparatus may further include a carrier driving part driving the carrier, and the carrier driving part may include the cooler driving part.

The carrier driving part may further include a cooling power part supplying electrical energy to the cooling part.

The cooling part may be attached to the carrier.

The cooling part may include a pipe, and cooling water or a cooling gas may be supplied to the pipe.

The cooling gas may be an inert gas.

The cooling part may be disposed away from the carrier.

The cooling part may include a plurality of cooling gas supply parts.

The plurality of cooling gas supply parts may be disposed at uniform intervals to correspond to the surface of the substrate mounted on the carrier.

The plurality of cooling gas supply parts may be gas injection holes through which a cooling gas is injected.

The cooling gas may be an inert gas.

A plurality of process chambers may be disposed in a direction, and the carrier may carry the substrate in the direction by mounting the substrate in another direction intersecting the direction at an angle.

The angle may be perpendicular to the direction.

An in-line manufacturing apparatus according to an embodiment may include a carrier that transports a substrate; a plurality of process chambers subjected to a manufacturing process on the substrate transported through the carrier; and a cooling part disposed in the carrier.

The in-line manufacturing apparatus may further include a carrier driving part driving the carrier, and the carrier driving part includes a cooler driving part.

The carrier driving part may further include a cooling power part supplying electrical energy to the cooling part.

The cooling part may include a pipe disposed in the carrier, and cooling water or a cooling gas may be supplied to the pipe.

The cooling part may be a gas injection hole through which a cooling gas is injected.

The plurality of process chambers may be disposed in a direction, and the carrier may carry the substrate in the direction by mounting the substrate in another direction intersecting the direction at an angle.

The angle may be perpendicular to the direction.

According to the in-line manufacturing apparatus according to an embodiment, it is possible to prevent the temperature increasing of the substrate within a plurality of chambers of the in-line manufacturing apparatus, and it is possible to prevent the performance deterioration and maintenance difficulties of the manufacturing apparatus because the inside of the process chamber is not complicated.

It is apparent that the effect of the described technology is not limited to the above-described effect, but may be variously extended within a range without departing from the spirit and scope of the embodiments.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
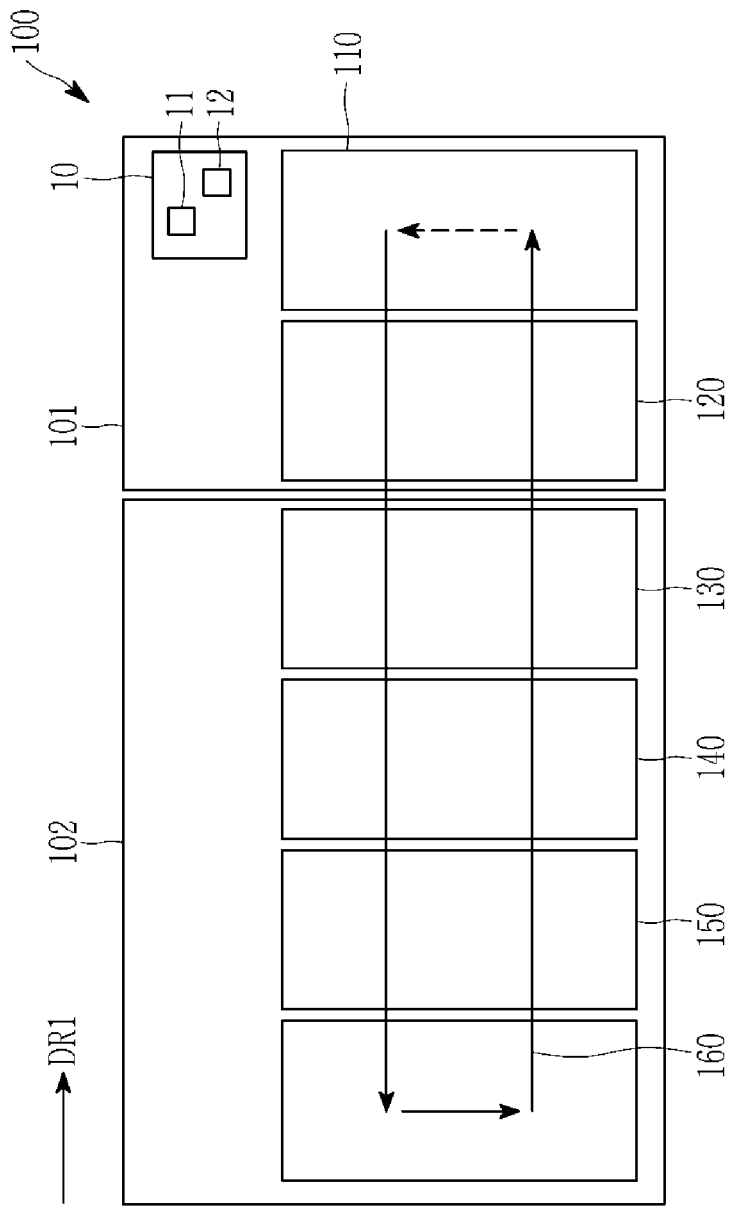
FIG. 1 is a schematic view of an in-line manufacturing apparatus according to an embodiment.

The embodiments will be described more fully hereinafter with reference to the accompanying drawings, in which embodiments are shown. As those skilled in the art would realize, the described embodiments may be modified in various different ways, all without departing from the spirit or scope of the described technology.

Descriptions of parts not related to the embodiments are omitted, and like reference numerals denote like elements throughout the specification.

In addition, the attached drawings are only for easy understanding of embodiments disclosed in the specification, and technical ideas disclosed in the specification are not limited by the attached drawings, and it should be understood to include all modifications, equivalents, or substitutes included in the ideas and technical ranges of the described technology.

Further, since sizes and thicknesses of constituent members shown in the accompanying drawings are arbitrarily given for better understanding and ease of description, the embodiment is not limited to the illustrated sizes and thicknesses. In the drawings, the thickness of layers, films, panels, regions, etc., may be exaggerated for clarity. In the drawings, for better understanding and ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Throughout the specification, the phrase "on a plane" means viewing the object portion from the top, and the phrase "on a cross-section" means viewing a cross-section of which the object portion is vertically cut from the side.

In addition, in the specification, when referring to "connected to", this does not mean only that two or more constituent elements are directly connected to each other, but the two or more constituent elements may be indirectly connected and physically connected through other constituent elements, and they may also be electrically connected or referred to by different names depending on the position or function, and may mean that they are one body.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, various embodiments and various variations are described in detail with reference to accompanying drawings.

An in-line manufacturing apparatus according to an embodiment is described with reference to FIG. 1 and FIG. 2. FIG. 1 is a schematic view of an in-line manufacturing apparatus according to an embodiment, and FIG. 2 is a schematic perspective view of an in-line manufacturing apparatus according to an embodiment.

Figure 2:
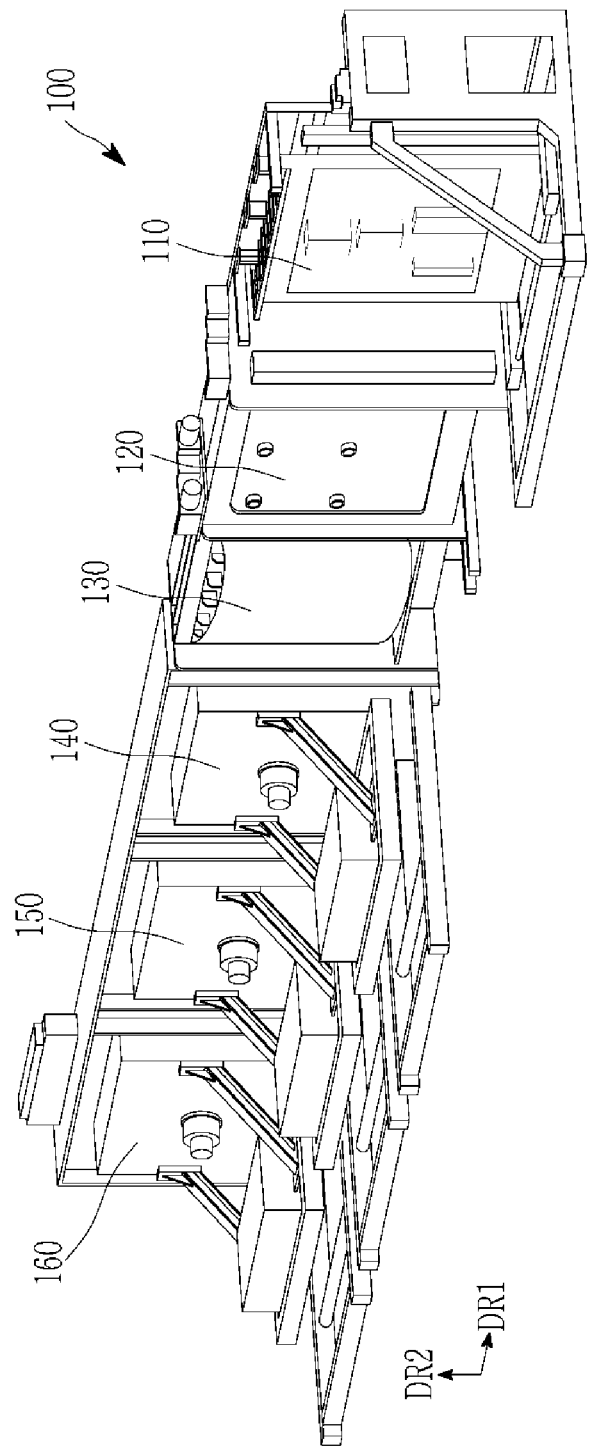
FIG. 2 is a schematic perspective view of an in-line manufacturing apparatus according to an embodiment.

Referring to FIG. 1 and FIG. 2, the in-line manufacturing apparatus 100 according to an embodiment includes a substrate loading/unloading unit 101 and a process unit 102.

The loading/unloading unit (or loading/unloading part) 101 and the process unit (or process part) 102 of the in-line manufacturing apparatus 100 may be disposed in a line along a first direction DR1.

The loading/unloading unit 101 may include a carrier 110 supporting and transporting a substrate, and a substrate waiting chamber 120.

The process unit 102 may include chambers 130, 140, 150, and 160, and chambers 130, 140, 150, and 160 of the process unit 102 may include a pre-heating chamber 130, a first process chamber 140, a second process chamber 150, and a third process chamber 160.

According to the illustrated embodiment, the process unit 102 has been described as including the first process chamber 140, the second process chamber 150, and the third process chamber 160, but the disclosure is not limited thereto, and the number of the chambers included in the process unit 102 is variable.

The loading/unloading unit 101 includes a carrier driving unit (or carrier driving part) 10, and the carrier driving unit 10 includes a cooler driving unit (or cooler driving part) 11 and a cooling power unit (or cooling power part) 12 to be described below.

The carrier 110 of the loading/unloading unit 101 supports the substrate after the substrate on which the process is performed is mounted, and as indicated by an arrow of FIG. 1, the substrate is transported sequentially along chambers 130, 140, 150, 160 of the process unit 102, and then returned to the loading/unloading unit 101, and the substrate on which the process is completed is unloaded.

The carrier 110 may be transported by supporting the substrate in a vertical direction, more specifically, in a state of standing the substrate in the second direction DR2 that is perpendicular to the first direction DR1. In addition, the carrier 110 may transport the substrate in a direction parallel to the first direction DR1 along chambers 130, 140, 150, and 160 that are disposed in a line.

Now, a part of the in-line manufacturing apparatus according to an embodiment is described in more detail with reference to FIG. 3 and FIG. 4 along with FIG. 1 and FIG.

2. FIG. 3 and FIG. 4 are lateral views showing a part of an in-line manufacturing apparatus according to an embodiment.

Figure 3:
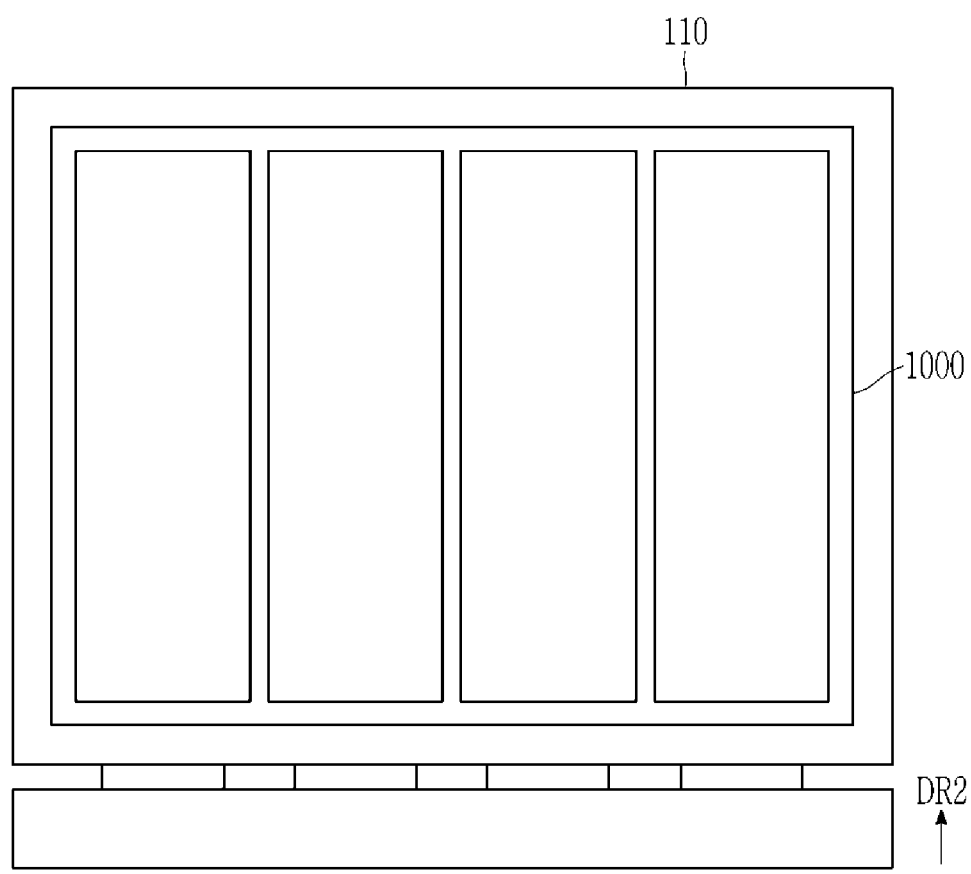
FIG. 3 and FIG. 4 are schematic lateral views illustrating a part of an in-line manufacturing apparatus according to an embodiment.
Figure 4:
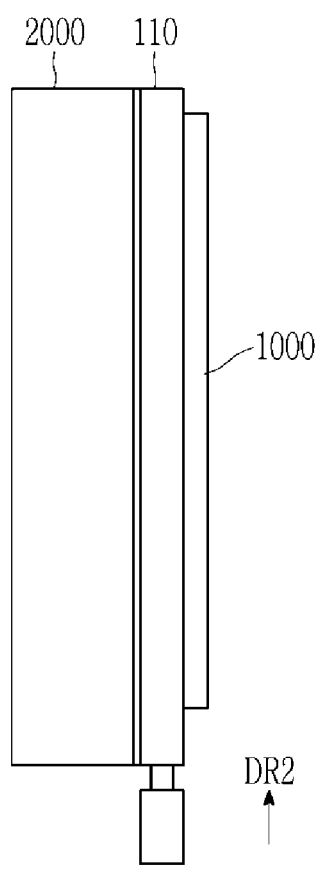

Referring to FIG. 3 and FIG. 4, the carrier 110 of the in-line manufacturing apparatus 100 according to an embodiment supports and transports the substrate 1000 in a state in which it is erected in the second direction DR2, which is a vertical direction.

In case that the substrate 1000 is supported and transported in the second direction DR2 that is the vertical direction, the area occupied by the carrier 110 becomes narrow when the substrate 1000 moves, thereby efficiently moving the substrate 1000.

However, the carrier 110 is not limited thereto, and the carrier 110 may support and transport the substrate 1000 in an inclined state to form a constant angle with the first direction DR1.

The in-line manufacturing apparatus 100 according to an embodiment may further include a cooling unit (or cooling part) 2000 disposed adjacent to the carrier 110.

The cooling unit 2000 may be positioned in the opposite direction to the substrate 1000 mounted on the carrier 110 based on the carrier 110.

The cooling unit 2000 may be disposed adjacent to the carrier 110 to be moved along with the movement of the carrier 110, and may cool the substrate 1000 in a state of being moved or in a state that the substrate 1000 is transported to the chambers 130, 140, 150, and 160 of the process unit 102 Substrate 1000. The cooling unit 2000 may be attached to the carrier 110, and may be installed spaced apart from the carrier 110 by a predetermined interval. In addition, the cooling unit 2000 may be mounted inside the carrier 110.

Although not shown, the in-line manufacturing apparatus 100 according to the embodiment may further include an additional cooling unit mounted inside at least some of the chambers 130, 140, 150, and 160 of the process unit 102.

Previously, as described with reference to FIG. 1 and FIG. 2, the loading/unloading unit 101 of the in-line manufacturing apparatus 100 according to the embodiment includes the carrier driving unit 10, and the carrier driving unit 10 includes the cooler driving unit 11 and the cooling power unit 12.

The cooler driving unit 11 of the carrier driving unit 10 may detect the surface temperature of the substrate 1000 mounted on the carrier 110, and control the operation of the cooling unit 2000 disposed to be adjacent to the carrier 110 and movable along with the carrier 110 according to the detected surface temperature of the substrate 1000.

The cooling power unit 12 of the carrier driving unit 10 may supply electrical energy to the cooling unit 2000.

The cooling power unit 12 may be a wired power source or may be a movable power source such as a rechargeable battery. More specifically, the cooling power unit 12 may have a rail shape, and the rail-shaped power supply may be disposed along the upper surface of the in-line manufacturing apparatus 100, disposed along the lower surface, or disposed along the side of the in-line manufacturing apparatus 100. In addition, the cooling power unit 12 may be a wireless battery that is movable along a rail for the power supply that is disposed along the upper surface of the in-line manufacturing apparatus 100, disposed along the lower surface, or disposed along the side of the in-line manufacturing apparatus 100.

In the loading/unloading unit 101, the substrate 1000 mounted on the carrier 110 is sequentially moved along chambers 130, 140, 150, and 160 of the process unit 102 while the process is performed, and as such, as the process progresses while moving along chambers 130, 140, 150, and 160, the temperature of the substrate 1000 may rise, and in case that the temperature of the substrate 1000 rises, the substrate 1000 is deformed by heat, and the surface of the substrate 1000 may not be flat, such that the surface height of the thin film deposited on the substrate 1000 may become non-uniform, thereby causing a defect in the manufactured device.

The in-line manufacturing apparatus 100 according to the embodiment includes the cooling unit 2000 adjacent to the carrier 110 on which the substrate 1000 is mounted, and senses the surface temperature of the substrate 1000 while mounting and moving the substrate 1000 by using the carrier 110, and in a case of unnecessary heating the substrate 1000, the surface temperature of the substrate 1000 may be lowered by using the cooling unit 2000. Therefore, it is possible to prevent the surface temperature of the substrate 1000 from increasing unnecessarily during the process, thereby preventing the occurrence of defects due to the increasing in the surface temperature of the substrate 1000.

According to the in-line manufacturing apparatus 100 according to the embodiment, the in-line manufacturing apparatus 100 may include the cooling unit 2000 that is disposed adjacent to the carrier 110 and is movable together with the carrier 110, and may control the cooling unit 2000 by using the cooler driving unit 11 in the carrier driving unit 10. By virtue of the structure of the chambers 130, 140, 150, and 160 of the process unit 102, the occurrence of malfunction of the in-line manufacturing apparatus 100 may be reduced.

In addition, by supplying the electrical energy to the cooling unit 2000 through the cooling power unit 12 separated from a power supply for supplying the electrical energy to chambers 130, 140, 150, and 160 of the process unit 102, the operation of the process unit 102 may not be affected by efficiently transferring the electrical energy to the chambers 130, 140, 150, and 160 of the process unit 102.

Since the cooling unit 2000 is disposed adjacent to the carrier 110 and is movable together with the carrier 110, if a failure occurs in the cooling unit 2000, the cooling unit 2000 may be individually repaired after moving only the carrier 110 and the cooling unit 20 to the loading/unloading unit 101 without repairing chambers 130, 140, 150, and 160.

In case that the cooling unit 2000 is installed in a storage unit (or storage part) for loading and storing the substrate 1000, the substrate 1000 may be cooled in the state in which the substrate is introduced or flows in or taken out of the process unit 102, however since the cooling unit 2000 of the in-line manufacturing apparatus 100 according to the embodiment is disposed adjacent to the carrier 110 that mounts and transports the substrate 1000, and is movable with the carrier 110, the substrate 1000 may be directly cooled if necessary at the desired position during the transporting as well as before and after the transport of the substrate 1000.

Figure 5:
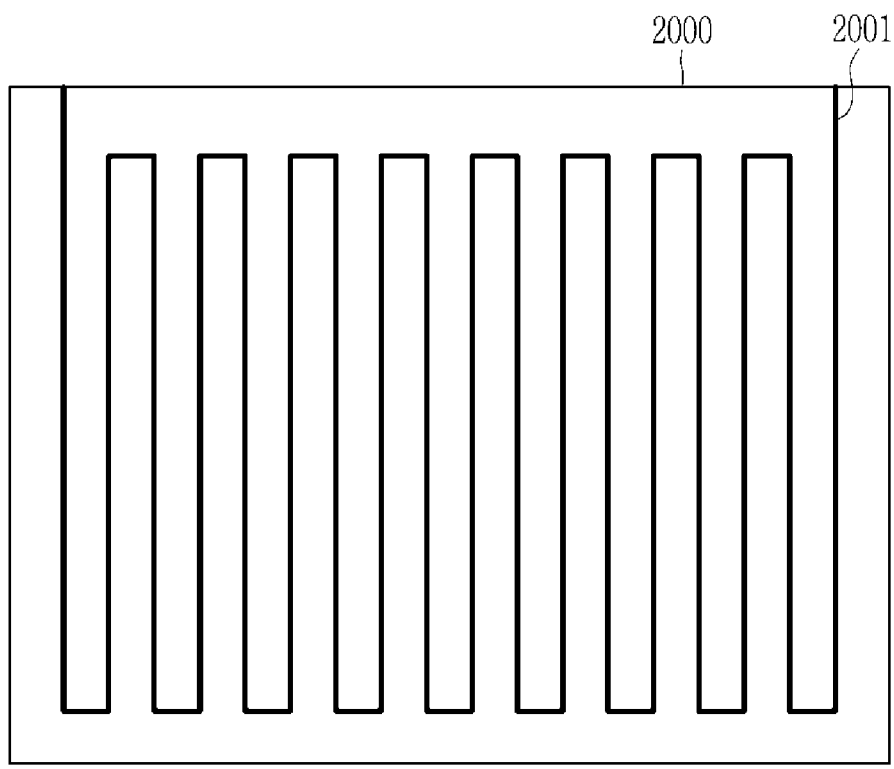
FIG. 5 is a schematic view illustrating a part of an in-line manufacturing apparatus according to an embodiment.

Now, a part of the in-line manufacturing apparatus according to an embodiment is described in more detail with reference to FIG. 5 along with FIG. 1 to FIG. 4. FIG. 5 is a schematic view showing a part of an in-line manufacturing apparatus according to an embodiment.

Referring to FIG. 5 along with FIG. 1 to FIG. 4, the cooling unit 2000 of the in-line manufacturing apparatus 100 according to the embodiment may include a pipe 2001, and cooling water or a cooling gas may flow through the pipe 2001.

The pipe 2001 may be installed on the surface adjacent to the carrier 110 among the surfaces of the cooling unit 2000, and the pipe 2001 may be disposed to correspond to (e.g., uniformly correspond to) the surface of the substrate 1000 mounted on the carrier 110.

By injecting the cooling water or cooling gas into the pipe 2001 of the cooling unit 2000, the surface temperature of the substrate 1000 mounted on the carrier 110 may be lowered.

The cooling water may be any liquid material of a low temperature (e.g., in a range of about ___ to about ___), and the cooling gas may be an inert gas, for example, an inert gas such as argon (Ar) or helium (He), but the disclosure is not limited thereto.

In case that the surface temperature of the substrate 1000 is unnecessarily increased, the cooling water or cooling gas may be injected into the pipe 2001 of the cooling unit 2000 by driving the cooler driving unit 11 in the carrier driving unit 10. Through this, the surface temperature of the substrate 1000 mounted on the carrier 110 may be lowered.

Some of the features of the in-line manufacturing apparatus 100 according to the embodiment previously described with reference to FIG. 1 and FIG. 2, and FIG. 3 and FIG. 4, may be applicable to the in-line manufacturing apparatus according to the embodiment including the cooling unit 2000 according to the embodiment.

Figure 6:
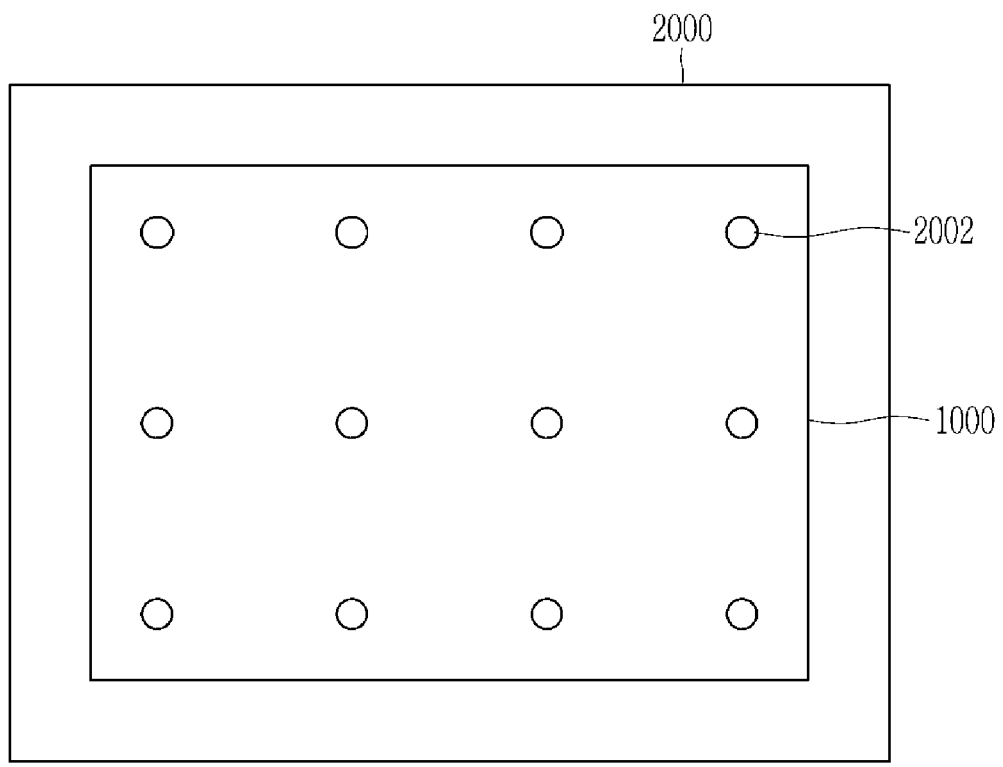
FIG. 6 and FIG. 7 are schematic views illustrating a part of an in-line manufacturing apparatus according to another embodiment.
Figure 7:
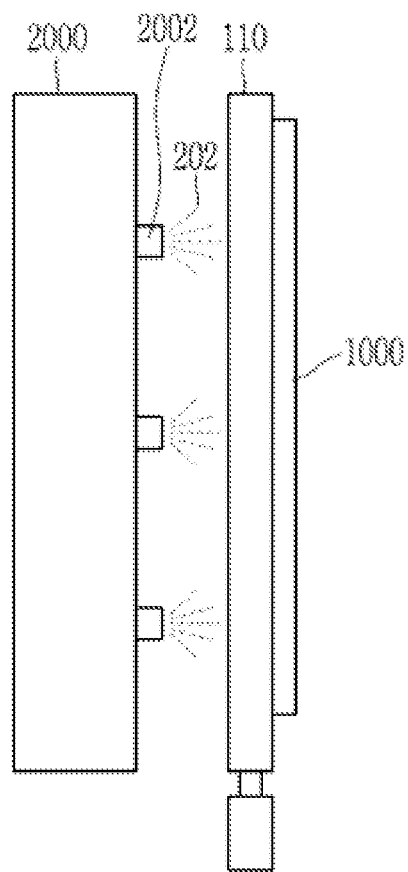

A part of the in-line manufacturing apparatus according to an embodiment is described in more detail with reference to FIG. 6 and FIG. 7 along with FIG. 1 to FIG. 4. FIG. 6 and FIG. 7 are views showing a part of an in-line manufacturing apparatus according to another embodiment.

Referring to FIG. 6 and FIG. 7 along with FIG. 1 to FIG. 4, the cooling unit 2000 of the in-line manufacturing apparatus 100 according to the embodiment includes cooling gas supply units (or cooling gas supply parts) 2002, and cooling gas supply units 2002 may be disposed with a predetermined interval to correspond to the surface of the substrate 1000 mounted on the carrier 110. For example, the cooling gas supply units 2002 may be disposed at uniform intervals to correspond to the surface of the substrate 1000 mounted on the carrier 110.

The cooling unit 2000 may lower the surface temperature of the substrate 1000 mounted on the carrier 110 by supplying the cooling gas 202 to the carrier 110 through cooling gas supply units 2002.

Cooling gas supply units 2002 of the cooling unit 2000 may be gas injection holes through which the cooling gas 202 is injected. The cooling gas 202 may be an inert gas, for example, an inert gas such as argon (Ar) or helium (He), but the disclosure is not limited thereto.

In case that the surface temperature of the substrate 1000 is unnecessarily high (e.g., in a range of about ___ to about ___), the cooling gas 202 is supplied through cooling gas supply units 2002 of the cooling unit 2000 by the driving of the cooler driving unit 11 in the carrier driving unit 10, so that the surface temperature of the substrate 1000 may be lowered.

Some of the features of the in-line manufacturing apparatus 100 according to the embodiment previously described with reference to FIG. 1 and FIG. 2, and FIG. 3 and FIG. 4, are applicable to the in-line manufacturing apparatus according to the embodiment including the cooling unit 2000 according to the embodiment.

Figure 8:
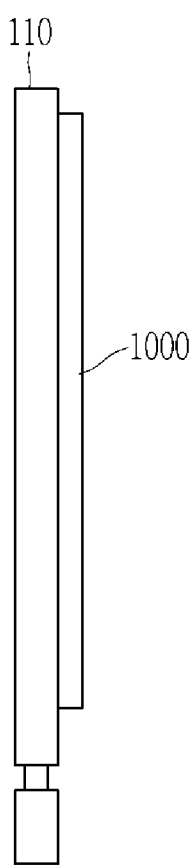
FIG. 8 and FIG. 9 are schematic views illustrating a part of an in-line manufacturing apparatus according to another embodiment.
Figure 9:
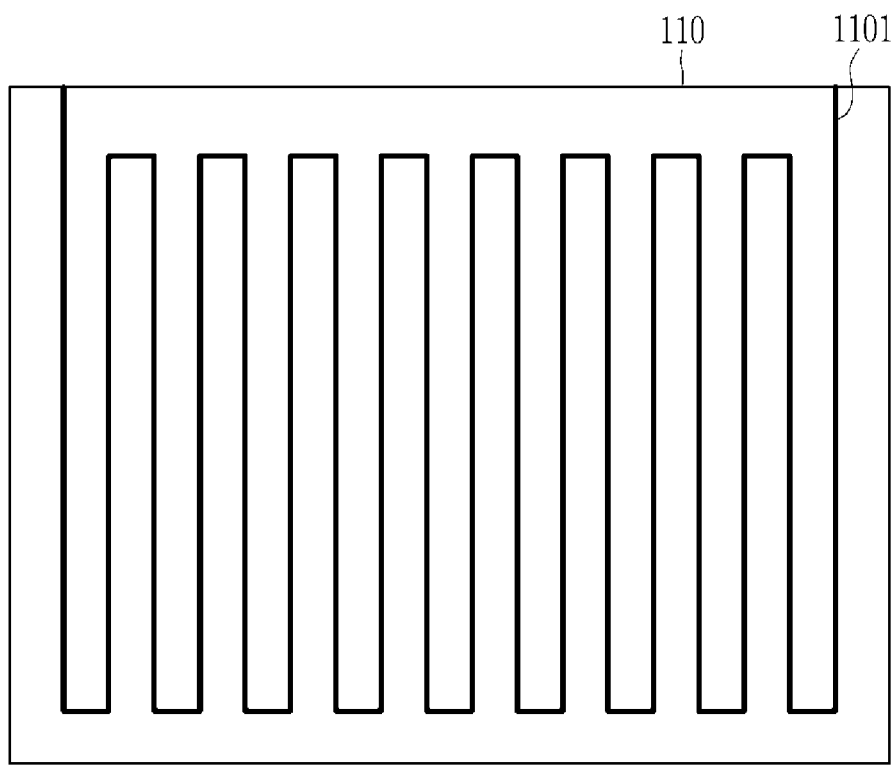

Next, a part of the in-line manufacturing apparatus according to an embodiment is described in detail with reference to FIG. 8 and FIG. 9 along with FIG. 1 to FIG. 4. FIG. 8 and FIG. 9 are views showing a part of an in-line manufacturing apparatus according to another embodiment.

Referring to FIG. 8 and FIG. 9 along with FIG. 1 to FIG. 4, the in-line manufacturing apparatus 100 according to the embodiment includes a cooling unit 1101 attached to the carrier 110.

Differently from the in-line manufacturing apparatus according to the above-described embodiments, the cooling unit 1101 of the manufacturing apparatus according to the embodiment may be installed in the carrier 110.

For example, as shown in FIG. 9, the cooling unit 1101 installed in the carrier 110 may be a pipe type to which the cooling water or the cooling gas is movable. However, the cooling unit 1101 is not limited thereto, and may be in the form of cooling gas supply units installed in the carrier 110, and various cooling units 1101 may be installed in the carrier 110.

In case that the surface temperature of the substrate 1000 is unnecessarily high, the cooling water or cooling gas is supplied to the cooling unit 1101 installed in the carrier 110 by the driving of the cooler driving unit 11 in the carrier driving unit 10, so that the surface temperature of the substrate 1000 may be lowered.

Some of the features of the in-line manufacturing apparatus 100 according to the embodiment previously described with reference to FIG. 1 and FIG. 2, and FIG. 3 and FIG. 4, are applicable to the in-line manufacturing apparatus according to the embodiment including the cooling unit 2000 according to the embodiment.

Figure 10:
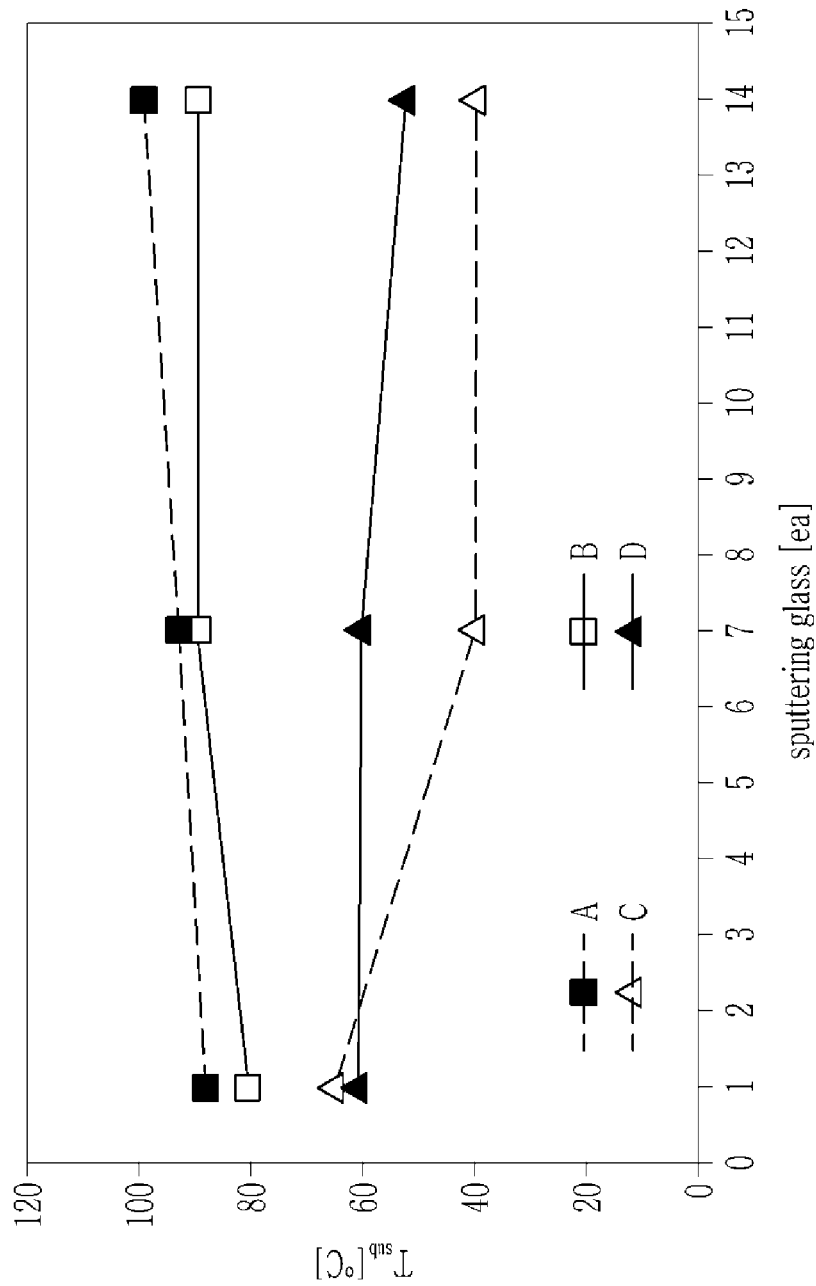
FIG. 10 is a graph showing a result of an experimental example.

Now, an experimental example is described with reference to FIG. 10. FIG. 10 is a graph showing a result of an experimental example.

In this experimental example, aluminum is deposited on fourteen (14) substrates with a thickness of about 6000 Å for two cases A and B without a cooling unit and two cases C and D with a cooling unit installed (or disposed). The temperature of the substrate surface is measured, and the result is shown in FIG. 10.

The X axis of FIG. 10 indicates the first to fourteenth substrates, and the Y-axis of FIG. 10 indicates the surface temperature of each substrate.

Referring to FIG. 10, it has been found that, similar to the in-line manufacturing apparatus according to an embodiment, in case that the cooling unit is included, the temperature of the substrate surface is lower than in case that the cooling unit is not installed.

Figure 11:
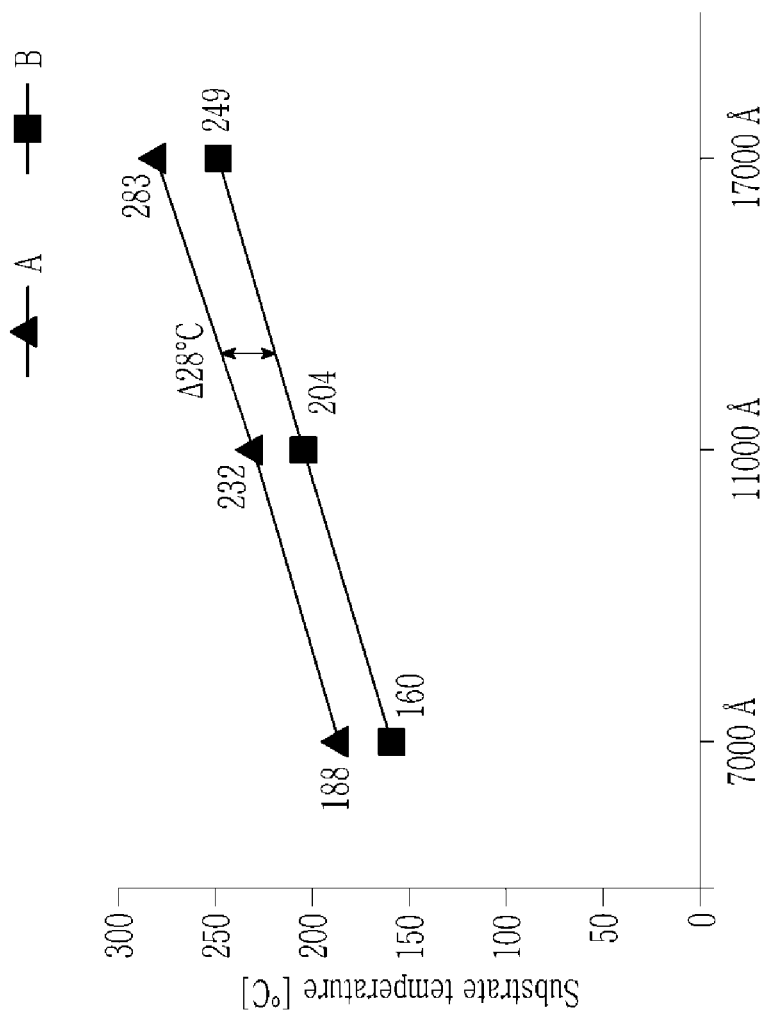
FIG. 11 is a graph showing a result of an experimental example.

Another experimental example is described with reference to FIG. 11. FIG. 11 is a graph showing a result of an experimental example.

In this experimental example, copper was deposited to a thickness of about 7000 Å, a thickness of about 11,000 Å, and a thickness of about 17,000 Å, and for a case A without installing a cooling unit and a case B installed with a cooling unit, the temperature of the substrate surface is measured, and the result is shown by a bent line graph.

Referring to FIG. 11, similar to the in-line manufacturing apparatus according to the embodiment, in the case including the cooling unit, it was found that the temperature of the substrate surface is lower than in case that the cooling unit is not installed, and the difference was about 28° C.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the disclosure.

What is claimed is:

1. An in-line manufacturing apparatus comprising:
a carrier that includes a first surface, a second surface opposing and spaced apart from the first surface, and at least one third surface connecting the first surface and the second surface, the carrier transporting a substrate while the substrate is disposed on the first surface of the carrier;
a plurality of process chambers subjected to a manufacturing process on the substrate transported through the carrier;
a cooler disposed adjacent to the carrier and movable with the carrier, the cooler being disposed on the second surface of the carrier; and
a carrier driver comprising:
a cooler driver configured to detect a surface temperature of the substrate and control operation of the cooler and being disposed adjacent to the carrier and movable along with the carrier according to the detected surface temperature of the substrate; and
a cooler power supply separate from any power supply of the plurality of process chambers, the cooler power supply separately supplying electrical energy to the cooler, wherein the carrier is disposed between the substrate and the cooler.

2. The in-line manufacturing apparatus of claim 1, wherein the cooler is attached to the carrier.

3. The in-line manufacturing apparatus of claim 2, wherein
the cooler includes a pipe, and
cooling water or a cooling gas is supplied to the pipe.

4. The in-line manufacturing apparatus of claim 3, wherein the cooling gas is an inert gas.

5. The in-line manufacturing apparatus of claim 1, wherein the cooler is disposed away from the carrier.

6. The in-line manufacturing apparatus of claim 5, wherein the cooler includes a plurality of cooling gas supply parts.

7. The in-line manufacturing apparatus of claim 6, wherein the plurality of cooling gas supply parts are disposed at uniform intervals to correspond to a surface of the substrate mounted on the carrier.

8. The in-line manufacturing apparatus of claim 7, wherein the plurality of cooling gas supply parts are gas injection holes through which a cooling gas is injected.

9. The in-line manufacturing apparatus of claim 8, wherein the cooling gas is an inert gas.

10. The in-line manufacturing apparatus of claim 1, wherein
a plurality of process chambers are disposed in a direction, and
the carrier carries the substrate in the direction by mounting the substrate in another direction intersecting the direction at an angle.

11. The in-line manufacturing apparatus of claim 10, wherein the angle is perpendicular to the direction.

12. An in-line manufacturing apparatus comprising:
a carrier that includes a first surface, a second surface opposing and spaced apart from the first surface, and at least one third surface connecting the first surface and the second surface, the carrier transporting a substrate while the substrate is disposed on the first surface of the carrier;
a plurality of process chambers subjected to a manufacturing process on the substrate transported through the carrier;
a cooler disposed in the carrier and including a pipe through which cooling materials are transferred within the cooler, the pipe including multiple bends as seen from a plan view perspective; and
a carrier driver comprising:
a cooler driver configured to detect a surface temperature of the substrate and control operation of the cooler and being disposed adjacent to the carrier and movable along with the carrier according to the detected surface temperature of the substrate; and
a cooler power supply separate from any power supply of the plurality of process chambers, the cooler power supply separately supplying electrical energy to the cooler, wherein the carrier is disposed between the substrate and the cooler.

13. The in-line manufacturing apparatus of claim 12, wherein
cooling water or a cooling gas is supplied to the pipe, and
the pipe extends within the carrier such that, while the cooling water or cooling gas is traveling between the first surface and the second surface, the cooling water or cooling gas travels in a direction parallel to the first surface of the carrier.

14. The in-line manufacturing apparatus of claim 12, wherein the cooler is a gas injection hole through which a cooling gas is injected.

15. The in-line manufacturing apparatus of claim 12, wherein
the plurality of process chambers are disposed in a direction, and
the carrier carries the substrate in the direction by mounting the substrate in another direction intersecting the direction at an angle.

16. The in-line manufacturing apparatus of claim 15, wherein the angle is perpendicular to the direction.

* * * * *